US009970965B2

(12) United States Patent
Whitehead

(10) Patent No.: US 9,970,965 B2
(45) Date of Patent: May 15, 2018

(54) DIRECT CURRENT DIGITAL VOLTAGE DISPLAY AND POLARITY CIRCUIT TESTER

(71) Applicant: Lisle Corporation, Clarinda, IA (US)

(72) Inventor: Michael L. Whitehead, Clarinda, IA (US)

(73) Assignee: Lisle Corporation, Clarinda, IA (US)

( * ) Notice: Subject to any disclaimer, the term of this patent is extended or adjusted under 35 U.S.C. 154(b) by 98 days.

(21) Appl. No.: 15/297,854

(22) Filed: Oct. 19, 2016

(65) Prior Publication Data

US 2017/0115331 A1    Apr. 27, 2017

Related U.S. Application Data

(60) Provisional application No. 62/245,453, filed on Oct. 23, 2015.

(51) Int. Cl.
*G01R 19/14* (2006.01)
*G01R 31/36* (2006.01)
*G01R 19/00* (2006.01)
*G01R 13/02* (2006.01)

(52) U.S. Cl.
CPC ......... *G01R 19/14* (2013.01); *G01R 13/0209* (2013.01); *G01R 19/0084* (2013.01); *G01R 31/3644* (2013.01)

(58) Field of Classification Search
CPC ........ G01R 1/06788; G01R 1/04; G01R 1/07; G01R 1/067; G01R 19/16561; G01R 19/2503; G01R 19/14; G01R 19/145; G01R 19/155; G01R 19/04; G01R 13/405; G01R 13/00; G01R 15/12; G01R 15/125; G01R 31/006; G01R 31/024; G01R 31/2841; G01R 31/3682; G01R 31/026; G01R 31/31915; G01R 29/0878; H01R 25/003
USPC ...... 324/72, 72.5, 113, 76.11, 754.01–754.3, 324/755.01–755.11, 762.01–762.1, 149
See application file for complete search history.

(56) References Cited

U.S. PATENT DOCUMENTS

| | | | | |
|---|---|---|---|---|
| 4,027,236 A | * | 5/1977 | Stewart | G01R 19/145 324/133 |
| 4,168,527 A | | 9/1979 | Winkler | |
| 4,298,837 A | | 11/1981 | Koslar | |
| 4,366,434 A | | 12/1982 | Ellis | |
| 4,599,557 A | * | 7/1986 | Cestaro | G01R 19/16557 324/133 |
| 5,008,613 A | * | 4/1991 | Steinel | G01R 1/06766 324/122 |
| 5,367,250 A | * | 11/1994 | Whisenand | G01R 19/16561 324/133 |

(Continued)

FOREIGN PATENT DOCUMENTS

WO    2014078892 A1    5/2014

*Primary Examiner* — Tung X Nguyen
*Assistant Examiner* — Lee Rodak
(74) *Attorney, Agent, or Firm* — Banner & Witcoff, Ltd.

(57) ABSTRACT

A sensor hand held tool for simultaneously direct current voltage measurement and polarity includes a conductive probe extending from a transparent handle. The transparent handle includes an axial cavity which retains an elongate, flat panel, non-transparent, circuit board with circuitry for sensing, measurement and digital display of direct current voltage as well as simultaneously sensing and visually indicating polarity of a contact to which leads extending from the tool may be attached.

8 Claims, 2 Drawing Sheets

(56) References Cited

U.S. PATENT DOCUMENTS

| | | | |
|---|---|---|---|
| 5,572,143 A * | 11/1996 | Myers | G01R 19/16557 |
| | | | 324/555 |
| 5,789,911 A * | 8/1998 | Brass | G01R 19/14 |
| | | | 324/133 |
| 5,898,299 A * | 4/1999 | Fodali | G01R 1/06788 |
| | | | 324/149 |
| 6,433,530 B1 * | 8/2002 | Pool | G01R 1/06788 |
| | | | 324/133 |
| 7,385,382 B2 | 6/2008 | Wilferd | |
| 2005/0057243 A1 * | 3/2005 | Johnson | G01R 1/06788 |
| | | | 324/754.02 |
| 2006/0028194 A1 | 2/2006 | Bosch | |
| 2009/0189597 A1 | 7/2009 | Lagerberg et al. | |
| 2011/0043191 A1 | 2/2011 | Gutierrez | |
| 2011/0265025 A1 * | 10/2011 | Bertness | G01R 31/006 |
| | | | 715/771 |

* cited by examiner

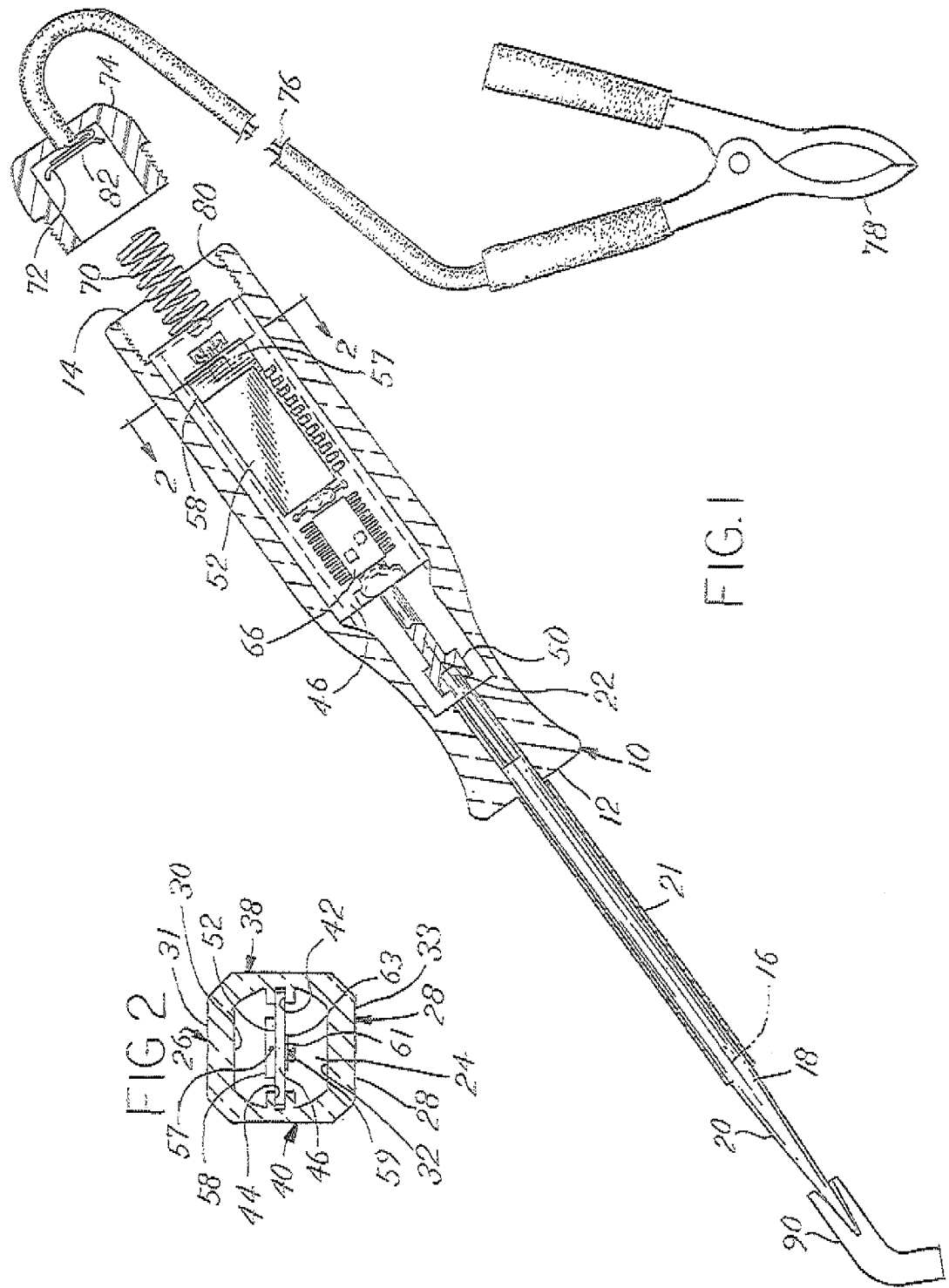

DIRECT CURRENT DIGITAL VOLTAGE DISPLAY AND POLARITY CIRCUIT TESTER

CROSS REFERENCE TO RELATED APPLICATION

This application is a utility application which claims the benefit of priority of provisional application Ser. No. 62/245,453 filed Oct. 23, 2015 entitled "Direct Current Digital Voltage Display and Polarity Circuit Tester", the content of which is incorporated herein by reference in its entirety.

BACKGROUND OF THE INVENTION

In a principal aspect the present invention relates to a direct current circuit, digital display and polarity testing device.

Mechanics and technicians often need to determine the polarity as well as the voltage associated with direct current circuits. Typically, the voltage of such circuits is in the range of up to 60 volts D.C. That is, computers and other devices associated with automotive and mechanical sensors and controls are generally part of lower voltage systems. As such, auto mechanics, technicians such as computer technicians and others that service control systems and mechanical devices, may desire to validate the magnitude of the direct current voltage as well as the polarity of devices that require service.

Various prior art devices have thus been developed which enable technicians and mechanics to measure polarity and/or voltage magnitude. Liquid crystal diodes are often incorporated in such test devices to visually indicate voltage of a particular system or device or circuit. Polarity is often determined by separate testing devices. Test equipment which measures voltage over a range and which may enable determination of polarity of a circuit have also been developed. Such devices, introduced into the marketplace, provide visual readout of voltage as well as visual indication of the polarity of a contact in a circuit. Thus, various types of digital display, direct current, circuit testers have been developed and introduced into the marketplace. Following is a listing of prior art patents directed to such technology:

LIST OF PATENTS AND PUBLICATIONS

| PATENT/ PUBLICATION NO. | ISSUE/ PUBLICATION DATE | INVENTOR | TITLE |
| --- | --- | --- | --- |
| 4,168,527 | Sep. 18, 1979 | Winkler | Analog and Digital Circuit Tester |
| 4,298,837 | Nov. 3, 1981 | Koslar | Hand Held Testing Device for Measuring Different Electrical Quantities |
| 4,366,434 | Dec. 28, 1982 | Ellis | Voltage Detectors and Electrical Continuity Checkers |
| 7,385,382 | Jun. 10, 2008 | Wilferd | Quick Reference Test Light probe with Digital Voltage Meter |
| 2006/0028194 | Feb. 9, 2006 | Bosch | Electronic Voltage polarity Test Probe |
| 2009/0189597 | Jul. 30, 2009 | Lagerberg et al. | Instrument for Testing an Electrical Circuit |
| 2011/0043191 | Feb. 24, 2011 | Gutierrez | Phoenix Probe X Voltage Tester |
| WO2014078892A1 | May 30, 2014 | Indyk | A Device and a Test Assembly for Testing the Integrity of a Low Voltage Electrical Network |

More recently, the release of products which combine the feature of a digital readout voltage sensor and a visual indicator polarity sensor have been combined into a single testing device. For example, Snap-On Tools in about January 2014 introduced such a direct current circuit tester (EECT400). The device incorporates liquid crystal diodes (LCD) and light emitting diodes (LED) with appropriate circuitry to measure direct current circuit or power source voltage for display on a panel in a digital format and also indicate polarity by virtue of correlating the color of a light emitting diode with the polarity of a contact point in a circuit.

Nonetheless, certain difficulties remain with respect to such testing devices. For example, the orientation of the testing devices may inhibit the ability to simultaneously observe an indication of circuit voltage readout and polarity of a contact in a circuit. That is, the component parts of the testing device may block visual display unless the test device is properly oriented. As a consequence, there has developed a desire and need for a testing device which enables prompt and simultaneous visual readout of voltage as well as the polarity of contacts associated with the circuit being tested.

SUMMARY OF THE INVENTION

In a principal aspect, the present invention relates to a hand held tool which simultaneously combines direct current voltage measurement and polarity sensing. The tool is easily manipulated and compact and includes a projecting, conductive probe extending from a transparent handle. The transparent handle includes an axial cavity which retains an elongate, flat panel, typically non-transparent, circuit board. The circuit board includes appropriate components and circuitry for sensing, measurement and digital display of direct current voltage as well as simultaneously sensing and visually indicating polarity of a contact to which leads extending from the tool may be attached.

A digital voltage readout is displayed by a liquid crystal diode (LCD) panel mounted on one side of the non-transparent circuit board slidably mounted in the handle cavity. Polarity sensors, comprised of light emitting diodes (LED) encapsulated in translucent or transparent blocks or housings, are mounted on each side of the circuit board in the cavity. The light emitting diodes (LED) are in parallel with each other and with the voltage measurement sensor and the associated liquid crystal diode (LCD) display. The light emitting diodes (LED), when activated, emit visual light in the same color simultaneously and prominently on both sides of the circuit board. One of the light emitting diodes (LED) is adjacent to and abutting the liquid crystal diode (LCD) readout panel in a manner that illuminates the panel to enhance the visual impact of the readout of the LCD panel and simultaneously provides visual indication of the polarity of a contact to which the probe point or contact end of the tool is engaged. The rear or back end of the tool includes a lead wire extending from the handle. The lead wire is connected in series to the circuitry and diodes mounted on the circuit board in the cavity.

The light emitting diodes (LED) are bicolor or tricolor diodes and thus, since they are in a parallel circuit, emit the same visible color response in the cavity chambers or sections separated by the non-transparent circuit board. Further, the light emitting diode (LED) abutting the liquid crystal diode (LCD) on one side of the circuit board augments the visibility of the liquid crystal diode.

Thus, it is an object of the invention to provide a digital, direct voltage current circuit tester which simultaneously indicates contact polarity in a manner that is highly visible.

It is a further object of the invention to provide a digital direct current voltage tester and polarity sensor which fully illuminates a generally transparent handle that encapsulates a circuit board and radiates a visual indication of the polarity of contacts in a circuit.

It is a further object of the invention to provide a digital, direct current circuit tester which may incorporate a contact clip at both contact ends of the device and which may include a removable contact assembly at a probe point contact end of the tester.

Yet another object of the invention is to provide an easily readable, lightweight, inexpensive and rugged digital direct current voltage readout tool and polarity indicator.

These and other objects, advantages and features of the invention will be set forth in the detailed description which follows.

BRIEF DESCRIPTION OF THE DRAWING

In the detailed description which follows, reference will be made to the drawing comprised of the following figures:

FIG. 1 is a plan view of an embodiment of the invention depicting a polarity sensor and digital direct current voltage testing device or tool;

FIG. 2 is a cross sectional view of the device of FIG. 1 taken along the line 2-2.

DESCRIPTION OF AN EMBODIMENT OF THE INVENTION

Figure 3:
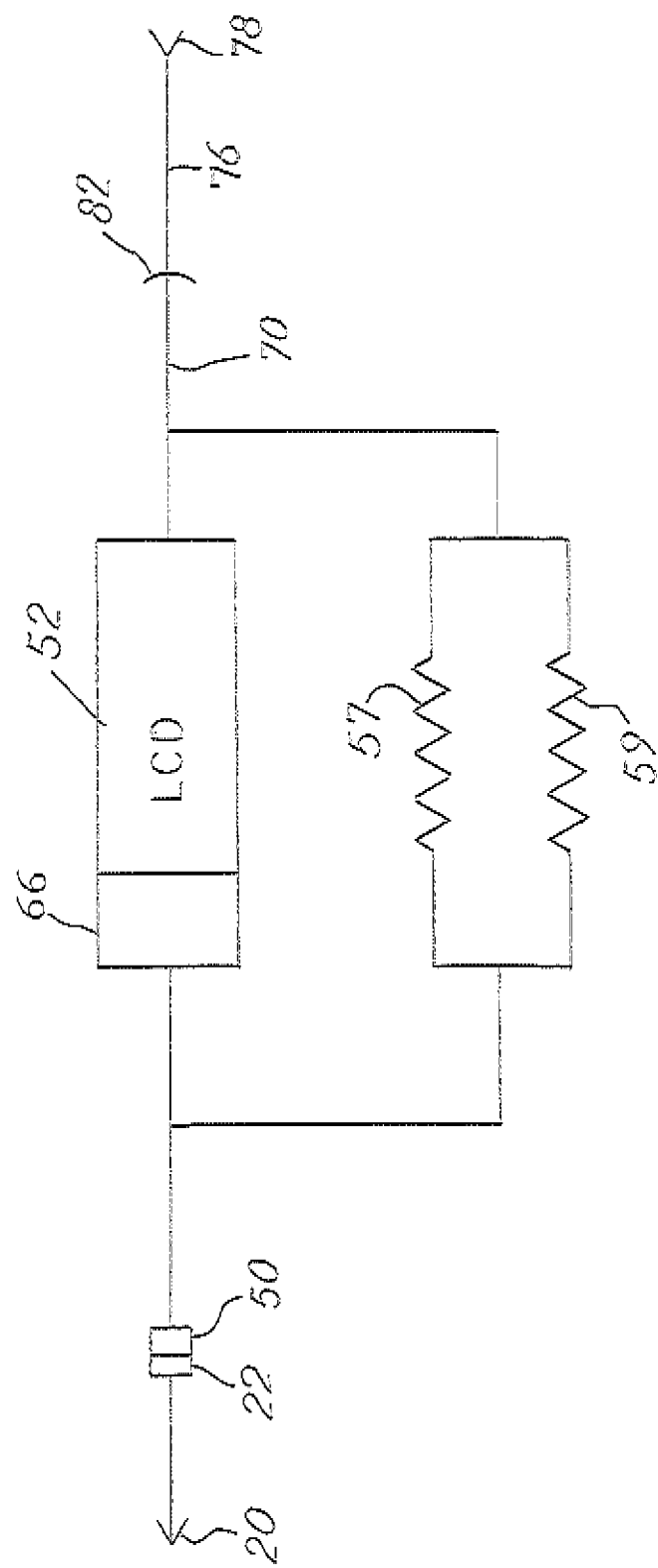
FIG. 3 is a circuit diagram schematically depicting a hypothetical circuit of a polarity sensor and digital direct current voltage measurement device or tool.

Referring to the figures, the tester or sensor device or tool includes a substantially transparent, molded plastic handle 10 having a front end 12 and an open back or rear end 14. The handle 10 further includes a straight, longitudinal, centerline axis 16. A conductive, elongate metal probe 18 in the form of a pointed rod extends axially from the front end 12 of the handle 10 and includes an outer end, probe point contact 20. The probe 18 is molded into the front end 12 of the plastic handle 10 and includes an axially aligned internal cylindrical configured contact 22 extending into an axial cavity 24 of handle 10. A protective, insulating sleeve 21 covers a portion of the probe 18 adjacent the outside of the front end 12 of handle 10.

The handle 10 internal, axial cavity or passage 24 is defined by opposed, generally parallel flat, spaced planar outside walls 26 and 28 having generally planar, parallel, inside faces 30 and 32. The walls 26, 28 and the inside faces 30, 32 are in opposed relation and are connected by transverse walls 38 and 40, respectively. The cavity passage or chamber 24 thus has a generally modified rectangular cross section shape or configuration. The flat outer faces 31, 33 are generally planar rectangles. The bottom and top or opposed inner connecting walls 38 and 40 may be curved or elliptical or flat. The inner connecting walls 38 and 40 each include interior, axially aligned, opposing, projecting longitudinal slots or grooves 42 and 44 designed to receive opposite parallel sides of a generally non-transparent, rectangular circuit board 46. The circuit board 46 thus slidably fits into the grooves 42, 44 from the open, rear end 14 of the handle 10. The circuit board 46 includes a projecting front end, cylindrical, tubular contact conductive rod member 50 which is aligned axially with the probe 18 and, more particularly, with the inner probe end, cylindrical contact 22. The circuit board contact member 50 is thus designed to conductively fit into and engage the cylindrical contact 22 of probe 18 to provide a series circuit connection to the elements mounted on circuit board 46. The walls 26, 28 are transparent and configured to avoid distortion of light emanating from the instrumentation within the chamber 24 mounted on the board.

One side of the circuit board 46, which comprises a generally rigid, flat, insulative non-transparent sheet, includes a liquid crystal diode (LCD) panel or assembly 52 mounted thereon. The liquid crystal diode panel 52 is mounted on board 46 in a manner which enables display of a digital readout with the base of numbers parallel to the axis 16 and in opposition to a wall, such as wall 26. Since the wall 26 is transparent, a clear digital readout from panel 52 can be observed through the wall 26.

The circuit board 46 further includes a voltage measurement and digital driver circuit panel 66 mounted in series between the tubular contact 50 and the liquid crystal diode assembly or panel 52 which is in a circuit parallel with polarity sensing light emitting diodes 57, 59 as schematically depicted in FIG. 3. Each diode (LED) 57, 59 is typically encapsulated in a transparent or translucent block 58, 61, respectively, and is mounted on a separate side of board 46. The light emitting diodes 57, 59 are typically selected from the group consisting of a bicolor light emitting diode and a tricolor light emitting diode. First diode block 58 is translucent or transparent, encapsulates diode 57, and is mounted on and adjacent or abutting the liquid crystal diode panel 52 on a first side of board 46 as depicted in FIG. 2. The second light emitting diode block 59 is encapsulated in a block 61 and is mounted on the second side of the board 46 opposite the first side. The light emitting diodes (LED) 57, 59 are each encapsulated in a translucent or transparent block of material so that excitation of the diodes 57, 59 in the block 58, 61 will illuminate and thus be visible and simultaneously direct light outwardly respectively towards walls 26, 28 on opposite sides of the circuit board 46. Diode (LED) 57 also directs light onto the liquid crystal diode (LCD) panel 52. A reflective panel 63 such as a metal foil panel 63 is typically positioned under or adjacent the block 61 or blocks 58, 61 to enhance light direction reflection and dispersion from the light emitting diodes (LED).

Thus, a series circuit is set up from the probe point of contact 20, through cylindrical contact 22, the tubular contact 50 connected to circuit board 46, the driver circuit 66 and the liquid crystal diode assembly 52 and the parallel light emitting diodes 57, 59 as depicted in FIG. 3. The circuit then connects from the board 46 through an elastic or conductive, axially aligned spring 70 to a concavely configured end 82 of a conductive contact 72 mounted or molded in a cap 74 connected to a lead wire 76 that terminates with a contact clip 78. The removable cap 74 is threadably attached to a threaded opening at the rear end 14 of the handle cavity 24. Open end handle threads 80 permit threading the handle 10 onto the cap 74 thereby maintaining the assembly of the component parts of the tool and enabling the elastic conductive member, such as a spring 70, to engage concave contact 82 mounted into the cap 74 and bias the component parts together.

The probe point of contact 20 of the probe 18 is, in one embodiment, in the form of a conical point. The probe point of contact 20 is fashioned for use in combination with various other types of clips, such as a banana clip or male probe contact 90. Thus the clip, such as contact clip 90, may be frictionally attached to probe point of contact 20.

In use, the clip 78 is typically attached to a vehicle ground and the probe contact point 20 is typically engaged with a contact of that device or item (such as a battery, etc.) being tested. Thus, when the clip 78 is attached to ground and the probe point of contact 20 is positioned on the device under test, a digital readout of the LCD assembly 52 will digitally display the voltage. Simultaneously, the color of the light emitting diodes 57, 59 (LED) will indicate the polarity of the contact which is engaged by the probe point of contact 20 such as red or "hot" or another visual, unique light emission.

In the event reversal of the probe point of contact 20 and clip 78 is performed, i.e., probe point of contact 20 is touched or contacted to ground, and the clip 78 is attached or touched in contact with the device being tested, the light emitting diodes 57, 59 will visually present another different unique visual response (e.g. green light) indicating that the tested contact is ground.

Because of the design of the light emitting diode 57, the light emitted through the diode block 58 will provide supplemental lighting for the liquid crystal diode panel 52 as well as on one side of the circuit board 46. Simultaneously, the second light emitting diode (LED) 59 will provide an identical visual color display of "hot" or "ground" engagement, as the case may be, by probe point of contact 20. The other LED 59 on the opposite side of the circuit board 46 is thus synchronized in color with LED 57. This arrangement overcomes a problem of placing a light emitting diode on only one side of the circuit board 46 resulting in blockage of the light from a diode (LED) to the opposite side of the board 46 and cavity or chamber 24. That is, a mechanic or technician who wishes to get a quick indication of the polarity of the circuit being tested may not be able to secure a quick and positive indication of polarity and may be obliged to maneuver the tool in a manner which may break contact of the probe point of contact 20 and thereby frustrate the measurement protocol.

Thus a circuit board with separate single light emitting diodes (LED), such as a bicolor light emitting diode, positioned to simultaneously backlight or light the liquid crystal diode (LCD) panel as well as provide visual LED light on both sides of the circuit board due to the manner in which the assembly is arranged provides a highly useful tool. That is, because the central cavity 24 is divided into two separate chambers which are substantially visually isolated from each other, the disclosed structure provides a light emitting diode (LED) in each chamber which functions in parallel and simultaneously. Also, the described embodiment, the light emitting diodes (LED) are typically encapsulated and mounted in a translucent or transparent block, each of which is fitted on distinct sides of the circuit board 46. Thus, each LED, upon activation, directs emitted light into a separate chamber, augmented by reflective panels, to enable simultaneous backlighting of the liquid crystal diode (LCD) panel and visual display of the light emitting diode (LED) on both sides of the circuit board 46 and outwardly from both chambers in the cavity 24 and through the walls of handle 10.

While there has been set forth an embodiment, the invention is to be limited by the following claims and equivalents thereof.

What is claimed is:

1. A digital voltage testing device comprising, in combination:

a generally transparent handle having a longitudinal center axis, a front end, an open back end, a generally straight, centerline axis between the front end and back end, an internal longitudinal cavity having a generally rectangular cross section transverse to the longitudinal center axis, defined by planar outer faces, the internal longitudinal cavity including two opposed, inner, generally flat parallel wall surfaces parallel to respectively, first and second opposite sides of said outer face, said internal flat surfaces joined by opposed connecting surfaces to form said cavity, said connecting surfaces each including an opposed axially aligned, straight slot in the cavity extending from the open back end into the cavity;

an axially extending elongate conductive probe molded into the handle at the front end and including an inner contact end, said probe extending from the interior of the cavity axially outwardly from the front end of the handle and having an external, terminal conductive end, and a generally non-transparent circuit board slidably inserted into the aligned slots, said circuit board including a conductive contact member axially aligned with and engaged in electric series with the inner contact end of the probe, said circuit board having a first side opposed to a first said inner wall and an opposite second side opposed to a second said inner wall;

said circuit board further including a liquid crystal diode digital panel mounted to said first side of the circuit board, said liquid crystal diode having a display face opposed to said first inner flat wall;

said circuit board further including a first bicolor light emitting diode encapsulated in a first block mounted to first side of the circuit board, said block positioned on said circuit board adjacent to and in electric series with the liquid crystal diode panel, said circuit board further including a second bicolor light emitting diode encapsulated in a second block mounted to the second side of the circuit board generally opposite the first light emitting diode, said light emitting second light emitting diode in parallel with the said first light emitting diode;

said circuit board further including a driver circuit in series with said circuit board contact member for sensing and display of voltage by said liquid crystal digital panel and for simultaneous visible actuation of the light emitting diodes for sensing and display of polarity of current; said light emitting diode actuation and display of visible light provided substantially simultaneously on each side of said circuit board respectively through the opposed handle walls and surfaces;

said device further including a removable cap attached to the open back end of the handle cavity, said cap including a lead wire extending from said cap to an outer contact clip, said cap further including a cap contact assembly mounted within the cap and connected in series to the lead wire for conductive coupling in series to the circuit board circuit from the diodes;

said circuit board comprising a segment of an electric series circuit from said probe to the outer contact clip including the liquid crystal diode and the first and second light emitting diodes in parallel in said series circuit and characterized by providing, respectively and simultaneously, a digital voltage display and a unique polarity visual output signal from said light emitting diodes upon contact respectively of the conductive probe to a positive voltage source contact or a negative voltage source contact.

2. The testing device of claim 1 wherein the probe includes an insulating sleeve.

3. The testing device of claim 1 wherein the external probe end is in the form of a generally conical point.

4. The testing device of claim 3 in combination with a conductive clip attached to the probe.

5. The testing device of claim 1 wherein the conductive contact member of the circuit board electrically connected to the probe is an elongate axial pin extending from the circuit board, said pin including an axial cylindrical opening for receipt and conductive engagement with the inner end of the probe.

6. The testing device of claim 1 wherein the contact assembly to the cap comprises a conductive spring member extending from the circuit board and in the series circuit, axially aligned with said spring, the circuit mounted on the circuit board and connected to and projecting axially from the circuit board and wherein the cap includes an inside conductive plate for engagement by the conductive spring to connect the series circuit to the lead wire extending from the cap.

7. The testing device of claim 1 further including a detachable external contact assembly including an attachment end compatible with the external conductive end.

8. The testing device of claim 1 including a light reflective panel on the second side of the circuit board positioned intermediate the second block and said circuit board.

* * * * *